United States Patent [19]
Farnworth et al.

[11] Patent Number: 5,286,679
[45] Date of Patent: Feb. 15, 1994

[54] METHOD FOR ATTACHING A SEMICONDUCTOR DIE TO A LEADFRAME USING A PATTERNED ADHESIVE LAYER

[75] Inventors: Warren M. Farnworth, Nampa; Ed A. Shrock, Boise; Scott Clifford, Boise; Jerrold L. King, Boise; Walter Moden, Boise, all of Id.

[73] Assignee: Micron Technology, Inc., Boise, Id.

[21] Appl. No.: 33,140

[22] Filed: Mar. 18, 1993

[51] Int. Cl.[5] .................................. H01L 21/60
[52] U.S. Cl. ........................... 437/209; 437/206; 437/214; 437/217; 437/220
[58] Field of Search .............. 437/209, 211, 217, 220, 437/214, 206

[56] References Cited

U.S. PATENT DOCUMENTS

| | | | |
|---|---|---|---|
| 4,835,120 | 5/1989 | Mallik et al. | 437/220 |
| 4,862,245 | 8/1989 | Pashby et al. | 357/70 |
| 4,994,411 | 2/1991 | Naito et al. | 437/217 |
| 5,012,323 | 4/1991 | Farnworth | 357/75 |
| 5,021,864 | 6/1991 | Kelly et al. | 357/70 |
| 5,086,018 | 2/1992 | Conru et al. | 437/220 |
| 5,140,405 | 8/1992 | King et al. | 357/67 |
| 5,142,450 | 8/1992 | Olson et al. | 437/220 |
| 5,145,099 | 9/1992 | Wood et al. | 228/9 |
| 5,173,451 | 12/1992 | Kinsman et al. | 437/209 |

*Primary Examiner*—Brian E. Hearn
*Assistant Examiner*—Kevin M. Picardat
*Attorney, Agent, or Firm*—Stephen A. Gratton

[57] ABSTRACT

An improved method for attaching a semiconductor die to a leadframe is provided. The improved method comprises forming a patterned adhesive layer on a side of a semiconductor wafer prior to singulation of the dies from the wafer. The adhesive layer is patterned such that wire bonding pads on the dies, as well as the streets between the dies, are free of adhesive material. The adhesive layer may be deposited and patterned using a hot or cold screen printing process, by depositing and photopatterning a photosensitive adhesive, or using a resist etch back method. During a packaging process for attaching a die to a leadframe, the adhesive layer is heated and the lead fingers of the leadframe are placed in contact with the die under pressure. In an alternate embodiment of the invention, the lead fingers, rather than a side of the dies, are coated with an adhesive layer.

22 Claims, 2 Drawing Sheets

METHOD FOR ATTACHING A SEMICONDUCTOR DIE TO A LEADFRAME USING A PATTERNED ADHESIVE LAYER

FIELD OF THE INVENTION

This invention relates to semiconductor packaging and more particularly to a novel method for attaching a semiconductor die to a leadframe by forming a patterned adhesive layer on a wafer or die.

BACKGROUND OF THE INVENTION

In semiconductor manufacture, a single semiconductor die (or chip) is typically mounted within a sealed package. In general, the package protects the die from damage (e.g. breakage, physical abuse) and from contaminants in the surrounding environment (e.g. moisture, chemicals) In addition, the package provides a substantial lead system for connecting the electrical devices formed on the die to a printed circuit board or other external circuitry.

Each die has a lower surface (also referred to as the back of the die) that is devoid of circuitry, and an upper surface (also referred to as the face of the die) having integrated circuitry constructed thereon The integrated circuitry is electrically accessible via die wire bonding pads which may be arranged in a variety of configurations on the face or edges of the die.

Typically the initial component in the packaging process is a leadframe. The leadframe is a metal frame which supports several dies for packaging and provides the leads for the final semiconductor package A typical leadframe strip is produced from metal sheet stock (e.g. a copper alloy) and is adapted to mount several semiconductor dies. During a conventional packaging process, each die is attached to a mounting paddle of the leadframe utilizing an adhesive layer. The adhesive layer is typically formed of an epoxy, acrylic, silicone, or polyimide material that is sandwiched between the bottom of the die and the mounting paddle.

Also, during the packaging process, the bond pads formed on the die are electrically connected to the leads of the leadframe using fine bond wires. Following the application of a polyimide protective layer to the face of the die, it, and a portion of the leadframe to which it is attached, is encapsulated in a plastic material, as are all other die-leadframe assemblies on the leadframe strip. After encapsulation, a trim and form operation separates the resultant interconnected packages and bends the leads of each package into the proper configuration.

Recent advances in semiconductor manufacture have led to higher circuit densities and improved packaging technologies. Some high density circuits, such as 16 mega bit memory devices, use the newly developed lead-on-chip (LOC) packaging technology. A lead-on-chip (LOC) semiconductor package is described in U.S. Pat. No. 4,862,245 to Pashby et al, which is assigned to IBM.

In general, a lead-on-chip (LOC) die is formed without a mounting paddle for the die. The lead fingers of the leadframe not only electrically attach to the bond pads via the bond wires but also adhere to the face of the die and support the die during the encapsulation process. Prior to the encapsulation process, the die, in effect, is mounted to the lower surfaces of the lead fingers. This configuration provides superior heat transfer from the die and shortens the length of the bond wires. In addition, this configuration enhances the reliability of the package seal.

A common method of attaching and wire bonding a LOC die to a LOC leadframe is known as area wire bonding or A-wire bonding. A conventional automated A-wire bonding process includes several process steps. Initially, for attaching the die to the lead fingers of the leadframe, an adhesive tape having a thermoset adhesive on both sides is attached to the underside of the leadframe fingers. The face of the die is then attached to the adhesive tape using heat and pressure. An oven is then used to cure the adhesive tape. After the tape is cured, the leadframe is transferred to a wirebonder machine where the bond wires are connected to the bond pads of the die and to the lead fingers of the leadframe. Via holes in the adhesive tape allow the bond wires to be attached to the bond pads on the die.

In general, the A-wire process is an expensive and complicated manufacturing process. In particular, the adhesive tape is an expensive component which adds to the manufacturing costs of the packaged chip. In addition, with the A-wire process an accurately cut piece of adhesive tape must be precisely attached to the leadframe fingers for each die. This is a delicate process and requires a precise indexing of the die and a precise alignment of the adhesive tape with the die, and with the lead fingers. Moreover, any warpage of the adhesive tape during attachment to the leadframe fingers may cause voids and adhesion problems during attachment of the die.

The A-wire process also requires that different sized tape widths and different sized tape punches for each die size be stocked by a semiconductor manufacturer. This also adds to the expense and complexity of the process. Furthermore, after the adhesive tape is punched out, a large amount of tape is wasted by the process.

In view of the foregoing limitations in the packaging of LOC dies, there is a need in the semiconductor art for an improved method for attaching semiconductor dies and particularly LOC dies to a leadframe. Accordingly, it is an object of the present invention to provide an improved method for attaching a semiconductor die to a leadframe during a chip packaging or encapsulation process. It is another object of the present invention to provide an improved method for attaching a semiconductor die to a leadframe in which an adhesive thermoplastic tape is not required It is a further object of the present invention to provide an improved method for attaching a semiconductor die to a leadframe that is effective, inexpensive and adaptable to large scale semiconductor manufacture.

SUMMARY OF THE INVENTION

In accordance with the present invention, an improved method for attaching a semiconductor die to a leadframe is provided. The method of the invention, broadly stated, comprises applying a patterned thermoplastic or thermoset adhesive layer to a side (front or back) of a semiconductor wafer and using the adhesive layer during a packaging process to attach the individual dies formed on the wafer to the lead fingers of a leadframe. During deposition, the adhesive layer is patterned to clear the streets of the wafer for saw cutting and to clear the wire bonding pads on the individual dies for wire bonding. Patterning of the adhesive layer can be accomplished by hot or cold screen printing the adhesive, by photopatterning a photosensitive adhesive or by utilizing a resist method of etch back.

Following deposition and patterning of the adhesive layer on the wafer, the individual dies are singulated from the wafer. During packaging, each adhesive coated die is attached to the lead fingers of a leadframe by heating the adhesive layer and pressing the lead fingers, adhesive and die together. If the adhesive layer is formed of a thermoplastic material, a separate oven cure for the adhesive is not required. (Utilizing a thermoset adhesive an oven cure would be required). Furthermore, the adhesive layer may be formulated to function as an additional passivating/insulating layer for protecting the wafer and the packaged dies. In some applications the adhesive layer formed between the die and lead fingers may function as an alpha barrier. The method of the invention is particularly suited to attaching a lead on chip (LOC) die to a leadframe. It may also be used however, to attach a lead-under chip (LUC) die to a leadframe and for chip stacking In an alternate embodiment of the invention, a thermoplastic or thermoset adhesive is applied directly to the lead fingers of the leadframe and the individual dies are then attached to the lead fingers These and other objects, features and advantages of the invention will be apparent from the following more particular description of the preferred embodiments of the invention as illustrated in the accompanying drawings.

DETAILED DESCRIPTION OF THE PREFERRED EMBODIMENT

Figure 1:
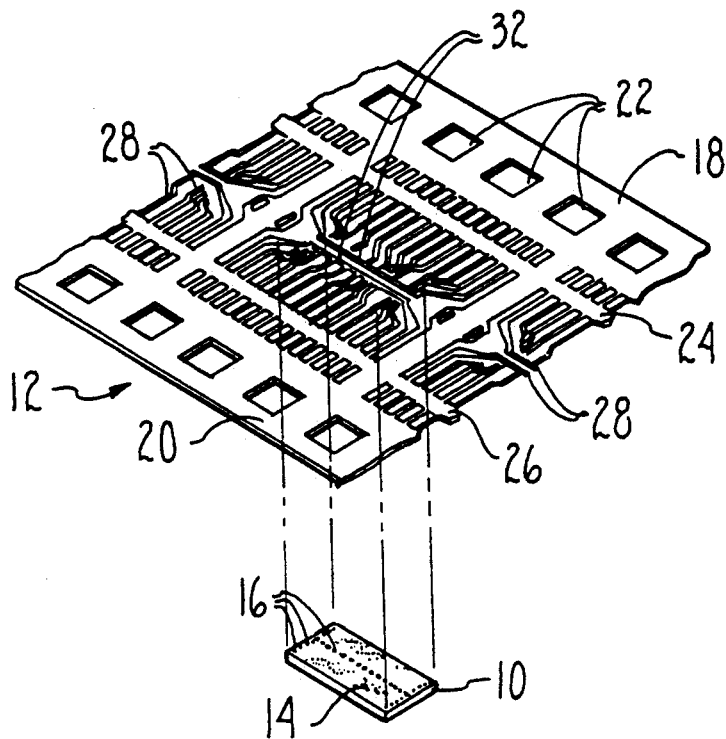
FIG. 1 is a perspective view of a prior art leadframe suitable for use with a lead-on-chip (LOC) die.

Referring now to FIG. 1, a representative prior art lead-on-chip (LOC) die 10 and lead-on-chip (LOC) leadframe 12 are shown. The LOC die 10 is thin, flat and generally rectangular in shape and includes a die face 14, or active side, wherein the integrated circuitry is formed. A plurality of die wire bonding pads 16 are formed across the center and side edges of the die 10 in electrical contact with the integrated circuits formed on the die 10.

The leadframe 12 is formed from metal sheet and includes side rails 18, 20 formed with indexing holes 22. The indexing holes 22 facilitate transport and indexing of the leadframe 12 by automated packaging machinery.

The leadframe 12 also includes sidebars 24, 26 (or dambars) for increased rigidity and to limit the flow of encapsulating material during the encapsulation process. The siderails 18, 20 and sidebars 24, 26 are trimmed away during a trim and form operation.

Furthermore, the leadframe 12 includes a plurality of generally parallel and spaced lead fingers 28. During the packaging process the lead fingers 28 are connected to thin bond wires 30 (FIG. 2) which also connect to the wire bond pads 16. The lead fingers 28 thus function to electrically connect the integrated circuitry formed on the LOC die 10 to external circuitry (e.g. a printed circuit board). In addition, the lead fingers 28 function to support the LOC die 10 during the packaging process and to facilitate heat transfer from the LOC die 10 The leadframe 12 also includes bus bars 32 for making multiple connections to the wire bond pads 16.

Figure 2:
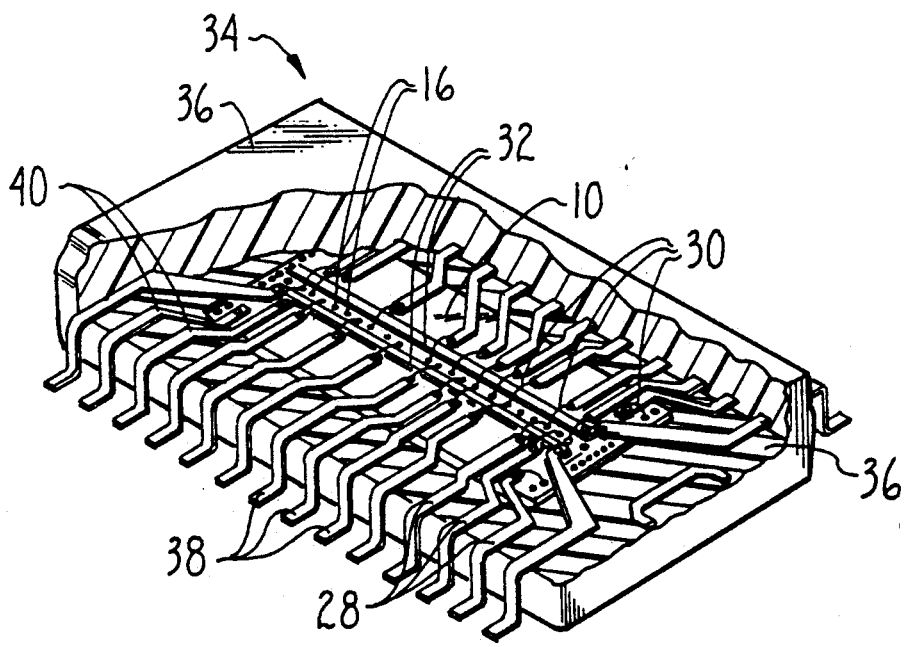
FIG. 2 is a perspective view of a prior art packaged lead-on-chip (LOC) die.

Referring now to FIG. 2, the packaged LOC die 10 or semiconductor package (or module) 34 is shown. The semiconductor package 34 includes an encapsulating material 36 which encapsulates the chip 10 and all but a terminal portion 38 of the lead fingers 28. Kinks 40 in the lead fingers 28 help to rigidify the assembly. The encapsulating material 36 is typically formed of an insulative plastic material. The LOC die 10 is located in the center of the package 34 with the wire bond pads 16 of the die 10 connected to the thin bond wires 30, which in turn connect to the lead fingers 28.

In addition to being attached to the thin bond wires 30, the lead fingers 28 also attach to the front side 14 of the die 10, or to an alpha barrier (not shown) attached to the die 10. Prior to encapsulation, the lead fingers 28 provide the only physical connection between the leadframe 12 and the LOC die 10. For attaching the lead fingers 28 to the die 10 a double faced adhesive tape is typically used. The process for attaching this adhesive tape was previously described in the background of the present invention with the discussion on A-wire bonding.

An illustrative embodiment of the present invention is directed to a novel and improved method for attaching a (LOC) die as previously described to a leadframe. The method of the invention generally stated, includes the following steps.

1. Forming an adhesive layer on a side of a semiconductor wafer formed with a plurality of dies.

2. Patterning the adhesive layer to clear streets for saw cutting the dies formed on the wafer and to clear wire bond pads formed on the dies.

3. Separating the dies from the wafer (e.g. saw cutting).

4. Heating the adhesive layer by heating a leadframe for the dies during a packaging process (Alternately, the dies themselves may be heated).

5. Attaching the lead fingers of the leadframe to a side of the dies during the packaging process by pressing the lead fingers, adhesive layer and die together.

6. Encapsulating the die and continuing the packaging process.

7. The patterned adhesive layer is applied to the front side of the wafer for attaching lead-on-chip (LOC) dies to a leadframe, or to a back side of the wafer for attaching lead-under-chip (LUC) dies to a leadframe or for chip stacking.

Alternately, instead of coating a side of a semiconductor wafer prior to die cutting, a patterned adhesive layer can be applied to the individual dies after they have been separated from the wafer. In an alternate embodiment of the invention, a patterned thermoplastic or thermoset adhesive layer is applied to the lead fingers of a leadframe rather than to the wafer or to the individual dies.

Figure 3:
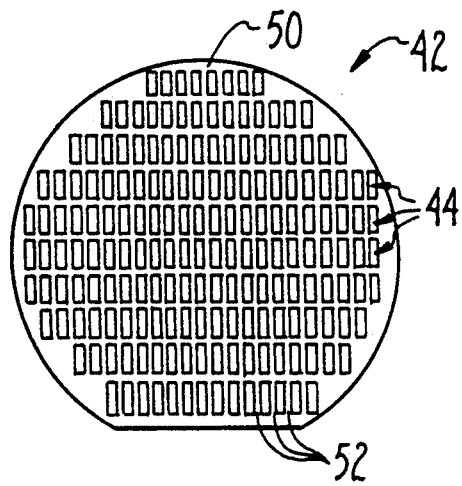
FIG. 3 is a plan view of a semiconductor wafer coated with a patterned adhesive layer in accordance with the method of the invention.
Figure 4:
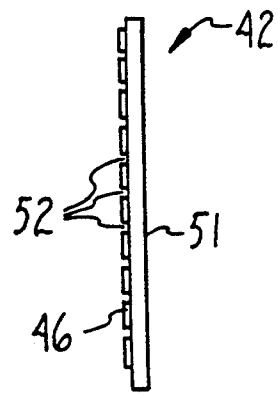
FIG. 4 is a side elevation view of FIG. 3.

Referring now to FIGS. 3 and 4, a semiconductor wafer 42 coated with an adhesive layer 46 in accordance with the invention is shown. The wafer 42 is manufactured with a plurality of dies 44 using various techniques which are known in the art. In accordance with the method of the invention, the front side 50 of the wafer 42 is coated with a patterned thermoplastic or thermoset adhesive layer 46. Deposition of the adhesive layer 46 follows the deposition of a final insulating-/passivating layer on the wafer 42. Alternately, the back side 51 of the wafer may also be coated with an adhesive layer (not shown) for lead under chip (LUC) die bonding, conventional die bonding, or as an adhesive interface for chip stacking Following or during the adhesive deposition process, the adhesive layer 46 is patterned such that streets 52 formed between the individual dies 44, for saw cutting the dies 44, are free of adhesive 46. These streets 52 are also variously known in the art as scribe lines, saw lines or avenues. With the streets 52 free of adhesive, the efficiency of the saw cutting procedure is unaffected by the adhesive layer 46. It is to be understood, however, that the invention can be practiced with adhesive located in the streets 52.

Figure 5:
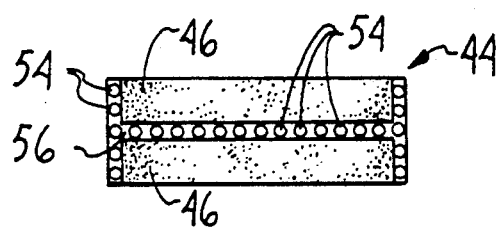
FIG. 5 is a plan view of a lead on-chip (LOC) die separated from the wafer and coated with an adhesive layer in accordance with the method of the invention.
Figure 6:
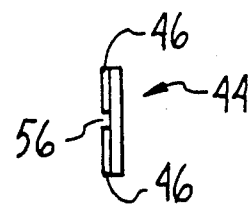
FIG. 6 is a side elevation view of FIG. 5.

In addition to the streets 52 preferably being free of adhesive, the adhesive layer 46 is patterned such that the bond pads 54 (FIG. 5) for the dies 44 are also free of adhesive. As shown in FIG. 5, this may be accomplished by patterning an adhesive free area 56 around the bond pads 54. This may also be accomplished by a finer patterning of the adhesive layer 46 such that rather than having wide adhesive free areas, only the bond pads 54 are clear of adhesive (not shown).

Figure 7:
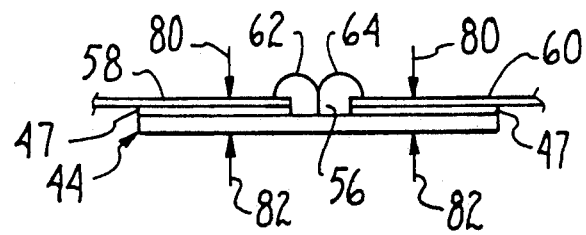
FIG. 7 is an enlarged cross sectional view showing the attachment of lead fingers and bond wires to a lead-on-chip (LOC) die in accordance with the invention.

With each die 44 coated with an adhesive layer 46, and as shown in FIG. 7, the lead fingers 58, 60 of a leadframe can be attached to the die 44 by heating the adhesive and by the application of pressure as indicated by pressure arrow 80, 82. Heating the adhesive layer 46 may be by heating the leadframe 12 or die 44 or both. Pressure may be applied by a suitable technique such as a movable arm pressing the assembly against a stationary platen. Under the effect of heat and pressure the adhesive layer 46 is in effect sandwiched between the lead fingers 58, 60 and the die 44 to form an adhesive layer 47 therebetween. This firmly attaches the die 44 to the lead fingers 58, 60 for the subsequent encapsulation process.

Following attachment of the die 44 and lead fingers 58, 60, fine bond wires 62, 64 can then be attached to the bond pads 54 of the die 44 and to the lead fingers 58, 60 during a wire bonding process After wire bonding an encapsulation process is performed to complete the semiconductor package.

By using a thermoplastic adhesive to form the adhesive layer 46 and heating the leadframe or die 44, a heat cure is not required to permanently bond the lead fingers 58, 60 and die 44. In general, a thermoplastic adhesive can be formulated of a solid thermoplastic material which quickly melts upon heating and then sets to a firm bond on cooling. As an example, suitable thermoplastic adhesive materials are known generally as polyimides. These materials are sold under the tradenames of Ablestik PI 5500 ®, and DuPont QL 3400 ®.

If a thermosetting adhesive is utilized, a separate heat cure is required to set the adhesive. Suitable thermoset adhesives are known generally as phenolic resins. One such suitable material is sold under the tradename Ablestik PI 5000 ®.

In addition to forming an adhesive layer 47 for attaching the die 44 to the lead fingers 58, 60 of a leadframe, the adhesive layer 46 can also be formulated to function as an additional passivating/insulating layer for the wafer 42 and the die 44. As an example, the thermoplastic adhesive layer 46 may be formulated to provide complete coverage of the die 44 similar to a die coat for BTMS (bottom to top metal shorts and thin film crack) protection. The adhesive layer 46 may also be formulated in some applications to function as an alpha barrier. In general, alpha barriers have been formulated of polymeric films having a melting temperature in excess of 175° C. and which do not contain ionizable species such as halides and active metals.

The adhesive layer 46 is preferably formed on the wafer 42 (and die 44) with a thickness of between about 8 $\mu$m to about 200 $\mu$m. The adhesive layer 46 may be applied to the wafer 42 and patterned by any suitable deposition method.

Figure 8:
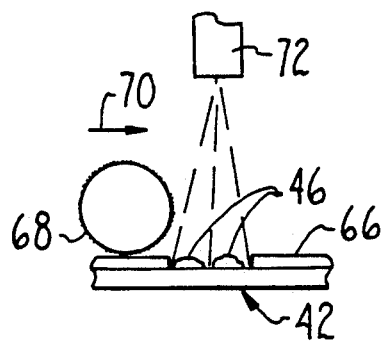
FIG. 8 is a schematic view showing a screen printing method for coating a wafer and dies with a patterned adhesive layer.

One such suitable deposition and patterning method is by using a hot screen printing process A hot screen printing process is similar to a silk screening process used for printing T-shirts and artwork. Such a process is shown schematically in FIG. 8. With a hot screen printing process, the wafer 42 is coated with a liquid adhesive layer 46 dispensed from a nozzle 72. A patterned screen 66 is situated between the wafer 42 and the nozzle 72 to provide the desired pattern. The hot screen printing process is preferably performed at an elevated temperature of about 100° C. to about 500° C. to facilitate the flowability of the adhesive. In addition, a dockering roller 68 (or blade), moveably mounted for motion across the screen 66 as indicated by arrow 70, can be used to aid in the distribution of the adhesive.

Alternately, in place of a hot screen printing process, a cold screen printing process could also be utilized Such a cold screen process could be accomplished by cold screen printing a suitable adhesive.

Furthermore, an adhesive layer could be deposited and patterned using a resist patterned with a solvent This is sometimes referred to as a resist etch back. In general, such a resist etch back would involve patterning the adhesive layer with a resist and then etching the resist with a suitable solvent.

Another suitable method for patterning the adhesive layer 46 is with a photopatterning process With photopatterning, an adhesive is formulated of a photosensitive material. This photosensitive material can be applied to the wafer 42 using a suitable deposition method (e.g. liquid deposition on a photoresist spinner followed by a hard bake). The photosensitive material is then exposed through a suitable mask or reticle and chemically etched in the desired pattern. Suitable photosensitive materials for such a process are known generally as polyimide siloxanes. Suitable etchants include $H_2SO_4$ for a wet etch process and $O_2$ for a dry etch process.

ALTERNATE EMBODIMENT

Figure 9:
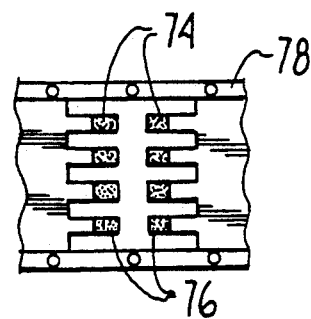
FIG. 9 is a schematic plan view showing the placement of an adhesive on the lead fingers of a leadframe in an alternate embodiment of the invention.

Referring now to FIG. 9, an alternate embodiment of the method of the invention previously described is shown. In the alternate embodiment, a thermoplastic or thermoset adhesive layer 74 is applied directly to the lead fingers 76 of a leadframe 78 instead of to the front side of the wafer or die as previously described. The adhesive layer 74 may be deposited in a pattern that matches the placement of the lead fingers on the die (e.g. just the ends of the lead fingers 76). As an example, an adhesive layer 74 can be formed on the lead fingers 76 by heating the leadframe 78 and dispensing a liquid adhesive using a spray on dispensing system similar to the hot screen printing process shown in FIG. 8. In addition, an electrostatic charge can be utilized to aid in the distribution of the adhesive on the lead fingers 76. This can be accomplished by charging a liquid adhesive and influencing its deposition pattern on the lead fingers 74 using suitably located charge plates.

Thus the invention provide an effective method for attaching a semiconductor die to a leadframe. Although the invention has been described in terms of preferred embodiments, as will be apparent to those skilled in the art, other applications of the inventive concepts disclosed herein are possible. It is intended therefore that the following claims include such alternate embodiments.

What is claimed is:

1. A method of attaching a semiconductor die formed with a plurality of bonding pads to a leadframe having a plurality of continuous metal lead fingers adapted to extend across a surface of the die for attachment to the bonding pads using fine bond wires, comprising:
   depositing an adhesive selected from the group consisting of thermoplastic adhesives or thermosetting adhesives on the die and patterning the adhesive to form a preapplied patterned adhesive layer on a surface of the die with the bonding pads of the die free of adhesive;
   heating the adhesive layer during a packaging process; and
   pressing the die, heated adhesive layer and lead fingers of the leadframe together during the packaging process to bond the adhesive layer and lead fingers and attach the lead fingers to the die.

2. The method as claimed in claim 1 and wherein the die is coated with an adhesive layer by depositing a patterned liquid adhesive layer on a front side of a wafer formed with a plurality of dies.

3. The method as claimed in claim 2 and wherein the adhesive layer is patterned such that the streets on the wafer between the dies are free of adhesive.

4. The method as claimed in claim 3 and wherein a liquid adhesive is deposited and patterned using a screen printing process.

5. The method as claimed in claim 3 and wherein a photosensitive liquid adhesive is deposited and patterned by a photopatterning/etching process and then hard baked to form the adhesive layer.

6. The method as claimed in claim 1 and wherein a liquid adhesive is deposited and patterned using a resist etch back process.

7. The method as claimed in claim 1 and wherein a liquid adhesive is deposited and patterned on a back side of a wafer formed with a plurality of dies.

8. The method as claimed in claim 3 and wherein the adhesive layer is heated during the packaging process by heating the leadframe.

9. The method as claimed in claim 3 and wherein the adhesive layer is heated during the packaging process by heating the die.

10. In semiconductor manufacture a method for attaching a semiconductor die to a leadframe, having a plurality of continuous metal lead fingers, said method comprising:
    forming a semiconductor wafer with a plurality of semiconductor dies having bond pads electrically connected to integrated circuits;
    coating a side of the wafer and dies with an adhesive selected from the group consisting of thermoplastic or thermosetting adhesives and patterning the adhesive to form a patterned adhesive layer on the wafer with the bond pads free of adhesive;
    separating the dies from the wafer;
    heating the patterned adhesive layer during a packaging process;
    pressing the lead fingers of the leadframe to a side of the adhesive coated die during the packaging process to bond the adhesive layer and leadframe and attach the lead fingers to the die; and
    continuing the packaging process.

11. The method as claimed in claim 10 and wherein a liquid adhesive is deposited and patterned using a hot screen printing process.

12. The method as claimed in claim 10 and wherein a liquid adhesive is deposited and patterned using a cold screen printing process.

13. The method as claimed in claim 10 and wherein a liquid adhesive is deposited and patterned using a solvent.

14. The method as claimed in claim 10 and wherein a photosensitive the liquid adhesive is deposited and patterned using a photopatterning process and is hard baked.

15. The method as claimed in claim 10 and wherein a liquid adhesive is deposited and patterned using a resist etch back process.

16. The method as claimed in claim 10 and wherein the adhesive layer is formed on a front side of the die for attaching a lead-on-chip (LOC) die to a lead-on-chip (LOC) leadframe.

17. The method as claimed in claim 10 and wherein the adhesive layer is formed on a backside of the wafer for attaching a lead-under-chip (LUC) die to a leadframe or for chip stacking.

18. The method as claimed in claim 10 and wherein the adhesive layer has a thickness of from about 8 $\mu$m to about 200 $\mu$m.

19. The method as claimed in claim 19 and wherein the adhesive layer is formulated to function as an insulating/passivating layer for the wafer.

20. A method for attaching a semiconductor die to a leadframe for a semiconductor package, comprising:
    providing a leadframe having a plurality of continuous lead fingers adapted to extend over a side of the die;
    applying an adhesive selected from the group consisting of thermoplastic adhesives or thermosetting adhesives to an underside of the lead fingers in a pattern that matches a placement of the lead fingers over the die to form a preapplied patterned adhesive layer;
    heating the patterned adhesive layer during a packaging process; and
    pressing the lead fingers, adhesive layer and die together to bond the adhesive layer and die and attach the lead fingers to the die.

21. The method as claimed in claim 20 and wherein a liquid adhesive is applied to the lead fingers and patterned to form the adhesive layer using a screen printing process.

22. The method as claimed in claim 20 and wherein the die is a lead-on-chip (LOC) die.

* * * * *